United States Patent [19]

Mishima et al.

[11] Patent Number: 5,369,719
[45] Date of Patent: Nov. 29, 1994

[54] OPTICAL DEVICE WITH AN OPTICAL COUPLER FOR EFFECTING LIGHT BRANCHING AND/OR COMBINING AND AN OPTICAL AMPLIFIER

[75] Inventors: Seiji Mishima; Yuichi Handa, both of Atsugi, Japan

[73] Assignee: Canon Kabushiki Kaisha, Tokyo, Japan

[21] Appl. No.: 899,472

[22] Filed: Jun. 16, 1992

[30] Foreign Application Priority Data

Jun. 21, 1991 [JP] Japan .................. 3-177124

[51] Int. Cl.$^5$ .................................... G02B 6/28
[52] U.S. Cl. .................................... 385/48; 385/14; 385/50; 359/341
[58] Field of Search ............ 385/14, 48, 50, 132; 372/6, 7; 359/341; 250/227.11, 227.24

[56] References Cited

U.S. PATENT DOCUMENTS

| | | | |
|---|---|---|---|
| 4,173,390 | 11/1979 | Käch .................. | 385/44 |
| 4,549,782 | 10/1985 | Miller .................. | 385/48 |
| 4,717,228 | 1/1988 | Thylén .................. | 385/41 |
| 4,768,849 | 9/1988 | Hicks, Jr. .................. | 385/48 |
| 5,016,960 | 5/1991 | Eichen et al. .................. | 385/48 |
| 5,109,444 | 4/1992 | Hanada et al. .................. | 385/14 |
| 5,134,671 | 7/1992 | Koren et al. .................. | 385/14 |
| 5,163,105 | 11/1992 | Knoll et al. .................. | 385/44 |

FOREIGN PATENT DOCUMENTS 0362789 4/1990 European Pat. Off. .
0414333 2/1991 European Pat. Off. .

Primary Examiner—Frank Gonzalez
Attorney, Agent, or Firm—Fitzpatrick, Cella, Harper & Scinto

[57] ABSTRACT

A first light waveguide is formed, and second and third light waveguides are respectively connected to the first light waveguide at first and second positions. A first coupler for effecting tight branching and/or combining is arranged near the first position, and a second coupler for effecting light branching and/or combining is arranged near the second position. An optical amplifier is arranged on the first light waveguide between the first and second positions for compensating for a light loss of a light wave caused by each of the first and second coupler.

44 Claims, 6 Drawing Sheets

OPTICAL DEVICE WITH AN OPTICAL COUPLER FOR EFFECTING LIGHT BRANCHING AND/OR COMBINING AND AN OPTICAL AMPLIFIER

BACKGROUND OF THE INVENTION

1. Field of the Invention

The present invention relates to an optical device for use in opto-electronic integrated circuits and the like which are needed in fields of optical communication and the like, and particularly, to an optical device with an optical coupler formed in a light waveguide for effecting light wave branching and/or combining and an optical amplifier which is suitable for use in opto-electronic integrated circuits having a plurality of transmitter and/or receiver portions for optical communication and similar devices or systems.

2. Related Background Art

In recent years, there has been proposed a structure in which a V-shaped groove is formed at a crossing part of crisscross waveguides as shown in FIG. 1 to build a coupler 71 for controlling transmission and reflection of light waves and in which the combining and/or branching of the light waves are conducted between a main waveguide 74 and two sub-waveguides 72 and 73 connected to the main waveguide 74.

In FIG. 1, optical amplifier portions 75 and 76 are arranged in the main waveguide 74 that forms a bus line, and the sub-waveguides 72 and 73 are respectively connected to receiver and transmitter portions (not shown) via optical fibers 77 and 78. The optical amplifier portions 75 and 76 respectively are composed of traveling-wave type lasers for directly amplifying a light signal on the main waveguide 75. The optical fibers 77 and 78 are respectively coupled to the sub-waveguides 72 and 73 by using butt coupling. Ratios of the light branching and combining are adjusted by controlling the light electro-magnetic field profile in the waveguide and the groove depth of the coupler 71. The groove can be formed by etching using fine working techniques such as Ga-focused ion beam (FIB) and reactive ion beam etching (RIBE).

Further, in FIG. 1, reference numerals 81 and 82 are optical fibers forming the bus line, and reference numerals 83a-83d are antireflection coats. In the structure of FIG. 1, multiplexed light signals are transmitted from the transmitter portion (not shown) and propagated through the optical fibers 81 and 82 in opposite directions via the optical coupler 71, and parts of light signals propagated through the optical fibers 81 and 82 are branched by the optical coupler 71 to be guided to the receiver portion (not shown) through the sub-waveguide 72 and the optical fiber 77. The light signal thus received by the receiver portion is demultiplexed and detected to generate desired information.

The structure of FIG. 1, however, has the following drawbacks. First of all, high process accuracies such as positional accuracy and depth control accuracy are needed for the coupler 71, and hence its yield and reproducibility are lowered. That is, strict accuracy is needed to the process since the manner of the light combining and branching is determined from the formation of the coupler 71 relative to a field profile of the light wave propagated through the light waveguides 72-74.

Further, in the structure of FIG. 1, while it is possible to perform the coupling of the light wave at equal ratio from the sub-waveguides 72 and 73 (the transmitter and receiver parts are connected thereto) to the main waveguide 74 or bus line in opposite directions, the branching ratio from the main waveguide 74 to the sub-waveguide 72 is different from that from the main waveguide 74 to the sub-waveguide 73. That is, compared with the branching ratio (e.g., −3 dB) toward a lower portion (i.e., a closed side) of the V-shaped coupler 71, the branching ratio (e.g., −6 dB) toward an upper portion (an open side) of the V-shaped coupler 71 is small. As a result, it becomes impossible to branch the light wave propagated through the main waveguide 74 into light waves propagated through the sub-waveguides 72 and 73 with equal intensity.

SUMMARY OF THE INVENTION

It is an object of the present invention to provide an optical device with an optical coupler and an optical amplifier for flexibly and properly adjusting an apparent branching and/or combining ratio of the optical coupler.

It is another object of the present invention to provide a light branching and/or combining method for flexibly and properly adjusting an apparent branching and/or combining ratio using an optical amplifier.

It is another object of the present invention to provide an optical communication system including an optical node which is composed of the optical device of the present invention.

According to one aspect of the present invention, an optical device comprises a first light waveguide for guiding a light wave, a second light waveguide for guiding a light wave which is connected to the first light waveguide at a first position, a third light waveguide for guiding a light wave which is connected to the first light waveguide at a second position different from the first position, a first light branching and/or combining device arranged near the first position, a second light branching and/or combining device arranged near the second position and an optical amplifier arranged on the first light waveguide guiding means between the first and second positions for compensating for a light loss of the light wave caused by each of the first and second light branching and/or combining device 6.

According to another aspect of the present invention, an optical device comprises a first light waveguide means for guiding a light wave, a second light waveguide for guiding a light wave which is connected to the first light waveguide at a first position, a third light waveguide for guiding a light wave, a fourth light waveguide for guiding a light wave which is connected to the third light waveguide at a second position different from the first position, a fifth light waveguide for guiding a light wave which extends between the first and second positions, a first light branching and/or combining device arranged near the first position, a second light branching and/or combining device arranged near the second position and an optical amplifier arranged on the fifth light waveguide between the first and second positions for compensating for a light loss of the light wave caused by each of the first and second light branching and/or combining devices. An amplification factor of the optical amplifier is set so that the wave light propagated through one of the first, second, third and fourth light waveguides is branched into the others of the first, second, third and fourth light waveguides with the same intensity.

According to yet another aspect of the present invention, a light branching and/or combining method comprises the steps of branching a first light wave into second and third light waves, amplifying at least one of the second and third light waves, branching the amplified light wave into fourth and fifth light waves.

According to yet another aspect of the present invention, an optical communication system comprises a plurality of optical nodes each comprising an optical device including a first light waveguide for guiding a light wave, a second light waveguide for guiding a light wave which is connected to the first light waveguide at a first position, a third light waveguide for guiding a light wave which is connected to the first light waveguide at a second position different from the first position, a first light branching and/or combining device arranged near the first position, a second light branching and/or combining device arranged near the second position and an optical amplifier arranged on the first light waveguide between the first and second positions for compensating for a light loss of the light wave caused by each of the first and second light branching and/or combining device, and a light transmission line for connecting the optical nodes. The light transmission line is connected to the first light waveguide.

These advantages and others will be more readily understood in connection with the following detailed description, claims and drawing.

DESCRIPTION OF THE PREFERRED EMBODIMENT

Figure 1:
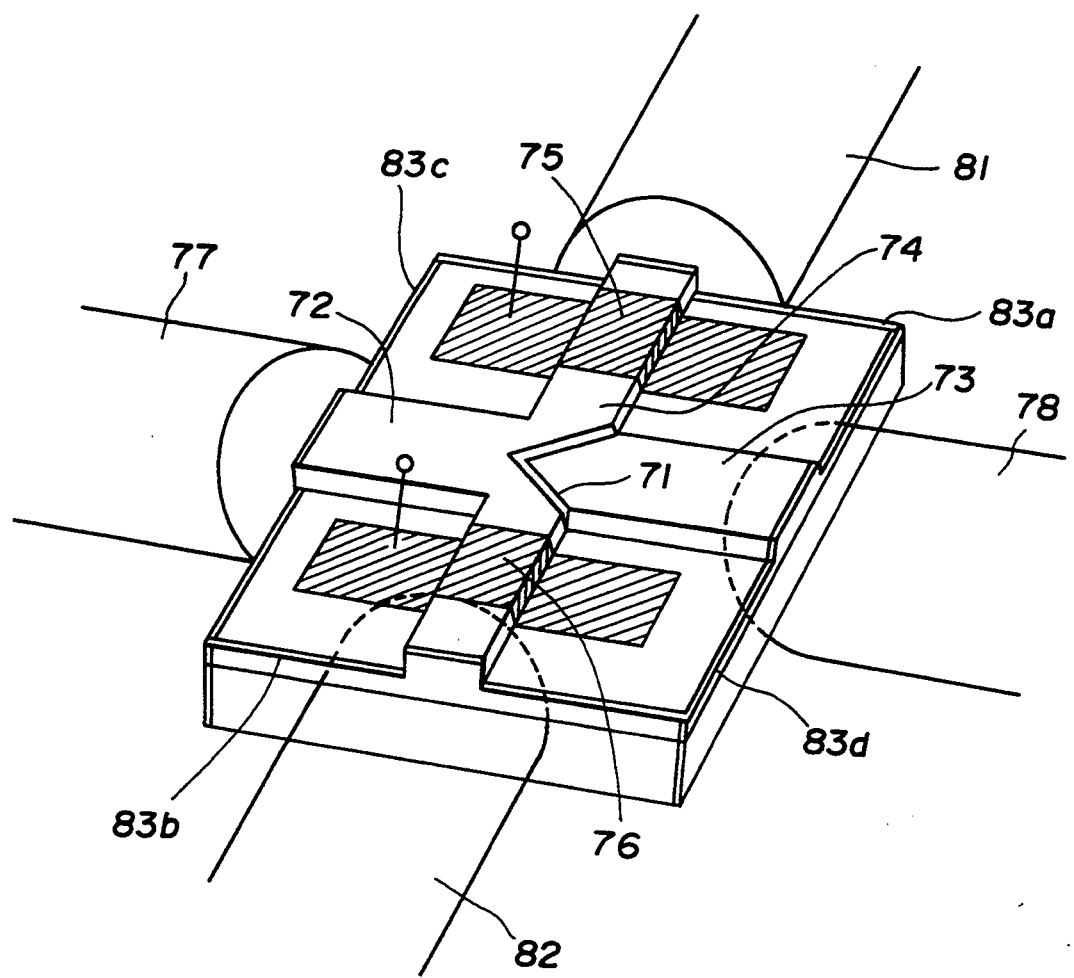
FIG. 1 is a perspective view of a prior art device.
Figure 2:
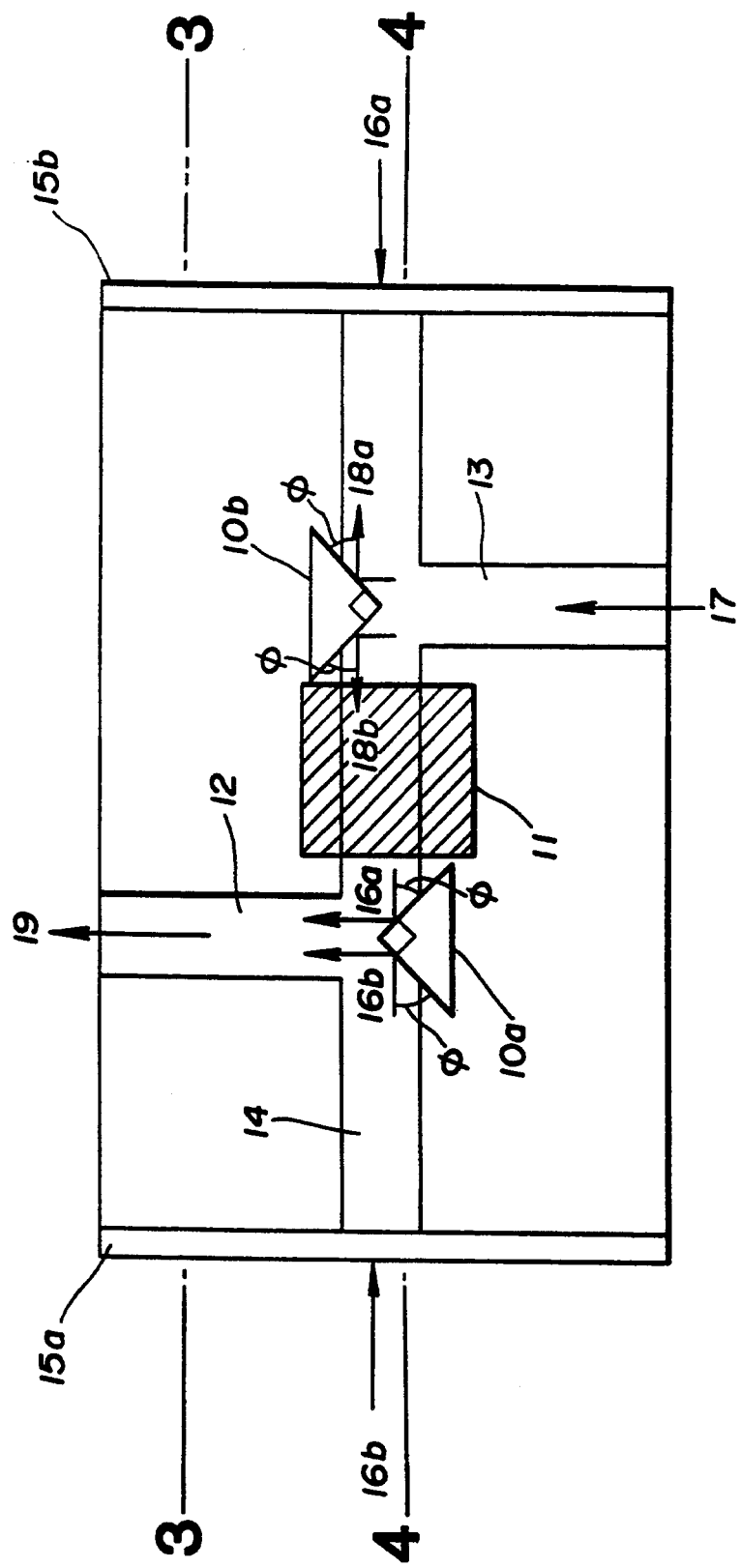
FIG. 2 is a plan view of a first embodiment of the present invention.
Figure 3:
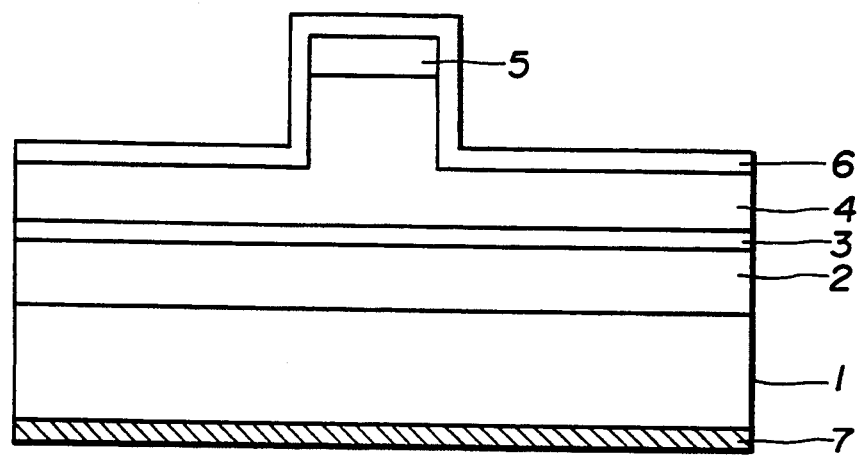
FIG. 3 is a cross-sectional view taken along a line A—A' of FIG. 2.
Figure 4:
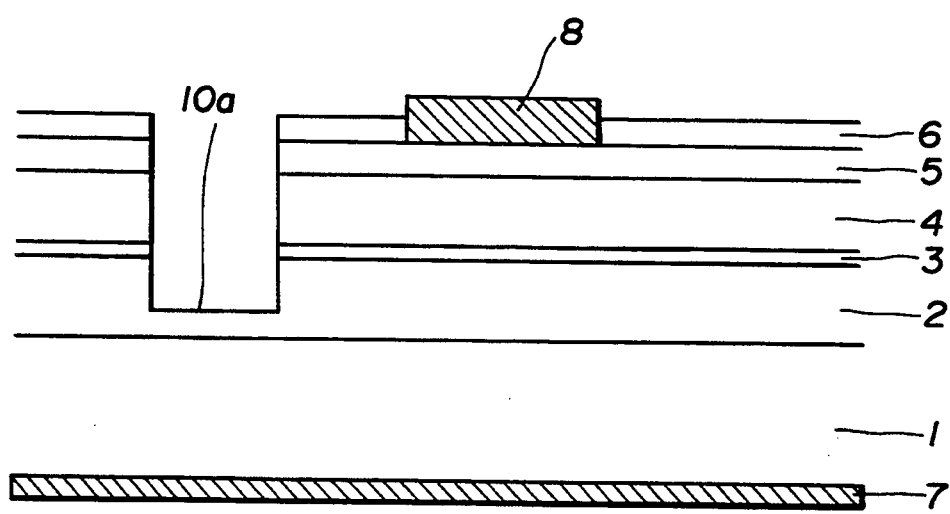
FIG. 4 is a cross-sectional view taken along a line B—B' of FIG. 2.

FIG. 2 illustrates a plan view of a first embodiment of the present invention which is an optical semiconductor device. FIG. 3 is an 3—' cross-sectional view of FIG. 2, and FIG. 4 is a 4—4' cross-sectional view of FIG. 2. In FIG. 2, reference numerals 10a and 10b are respectively etched grooves each forming an optical coupler or a light combining and/or branching device, reference numeral 11 is an optical amplifier portion which operates by a current injection a little below its threshold thereinto, reference numeral 12 is a sub-waveguide for guiding a light wave to a receiver part (not shown) for light detection, reference numeral 13 is a sub-waveguide for guiding a light wave transmitted from a transmitter part (not shown) and reference numeral 14 is a main waveguide which intersects each of the sub-waveguides 12 and 13 in a T-shaped configuration.

The fabrication process of the first embodiment is performed as follows:

As is shown in FIGS. 3 and 4, a first clad layer 2 of an AlGaAs layer, an active layer 3 of a GaAs layer, a second clad layer 4 of an AlGaAs layer and a cap layer 5 of a GaAs layer are successively grown in this order on a substrate 1 of an n-type GaAs layer by molecular beam epitaxy (MBE) method. When necessary, a buffer layer of a GaAs layer may be layered at a boundary between the substrate 1 and the first clad layer 2. Thicknesses of the first and second clad layers 2 and 4 are respectively 1 μm, and a thickness of the active layer 3 is approximately 0.1 μm.

Next, a desired pattern having a width of 3 μm corresponding to the pattern of the main waveguide 14 and the sub-waveguides 12 and 13 shown in FIG. 2 is formed on the cap layer 5 by photolithography. A ridge or rib portion (see FIG. 3) is then formed by reactive ion beam etching (RIBE) method, and thus a stripe structure for confinement in a lateral direction is built. The three-dimensional channel waveguides 12, 13 and 14 are formed in such a manner.

An insulating film 6 of SiN is then deposited on the substrate 1 having the ridge portion by plasma chemical vapor deposition (CVD) method, and a pattern of a window for a current injection is formed by photolithography. Thereafter, the $Si_xN_y$ insulating layer 6 is etched by RIBE to form the current injection window. A Cr-Au ohmic electrode 8 which functions as an upper electrode of the optical amplifier portion 11 is then formed by vacuum deposition method, and an AuGe-Au electrode 7 which functions as an n-type ohmic electrode 7 is deposited on the bottom surface of the substrate 1 after the GaAs substrate 1 is lapped to the thickness of 100 μm. A thermal treatment is performed to obtain ohmic contacts of the n and p-type electrodes 7 and 8, and the optical amplifier portion 11 is thus fabricated.

Further, 45° mirrors or total reflection mirrors for performing internal total reflections with respect to opposite directions are formed by fabricating etched grooves 10a and 10b by RIBE. The etched grooves 10a and 10b respectively have two end surfaces forming right angles therebetween, vertically extending to a lower part of the active layer 3, forming angles $\phi = 45°$ relative to light wave propagation directions and horizontally extending from central points of the branching and/or combining portions of the ridge waveguide 14. The etched grooves 10a and 10b are respectively formed at opposite extending sides of the main waveguide 14 to each other.

Finally, end surfaces of the instant device are formed by cleavage, antireflection coats 15a and 15b are formed by depositing $ZrO_2$ on the cleaved end surfaces by electron beam (EB) deposition method, and the electrodes 7 and 8 are drawn out by wire bonding.

The operation of the first embodiment is as follows. A light wave 17 which enters the sub-waveguide 13 is branched into two light waves 18a and 18b propagated through the main waveguide 14 in opposite directions by the coupler 10b with intensities of −6 dB. While the light wave 18a is emitted from the main waveguide 14 maintaining its intensity, the light wave 18b is further subjected to a light loss of −6 dB when passing through the coupler 10a. Therefore, the amplification factor of the optical amplifier portion 11 is set to compensate for such light loss. Thus, the light waves 18a and 18b can be propagated through the main waveguide 14 in the opposite directions and emitted with the same intensities.

On the other hand, light waves 16a and 16b incident on the main waveguide 14 from opposite directions are respectively branched by the coupler 10a to create a light wave 19 propagated through the sub-waveguide 12. At this time, the light wave 16a is subjected to the light loss of −6 dB mentioned above when passing through the coupler 10b. However, the light waves 16a and 16b propagated through the main waveguide 14 in the opposite directions can be propagated through the sub-waveguide 12 with the same intensities by properly setting the amplification factor of the optical amplifier portion 11 as mentioned above.

In this embodiment, the couplers 10a and 10b or the combining and/or branching devices are formed by a wave front splitting type coupler with respect to a horizontal direction (i.e., an extension direction of the substrate 1 on which the channel waveguide structure is formed). As a result, no strict depth control accuracy is needed so long as the depth of the end surfaces of the etched grooves 10a and 10b extend beyond the active layer 3 as shown in FIG. 4.

The ridge waveguide is adopted in this embodiment, but a refractive index type waveguide or similar waveguide may be used as a channel waveguide.

Further, in the first embodiment, the light waves 16a and 16b incident on the main waveguide 14 can be branched into the light wave 19 propagated through the sub-waveguide 12 and a light wave propagated through the sub-waveguide 13 with the same intensities owing to the amplifier portion 11, respectively. Moreover, the light waves 16a and 16b incident on the main waveguide 14 can be emitted from the main waveguide 14 in opposite directions maintaining their intensities at a sufficiently high level, and the light wave 17 from the sub-waveguide 13 can be guided to the receiver portion through the sub-waveguide 12 to be monitored.

Figure 5:
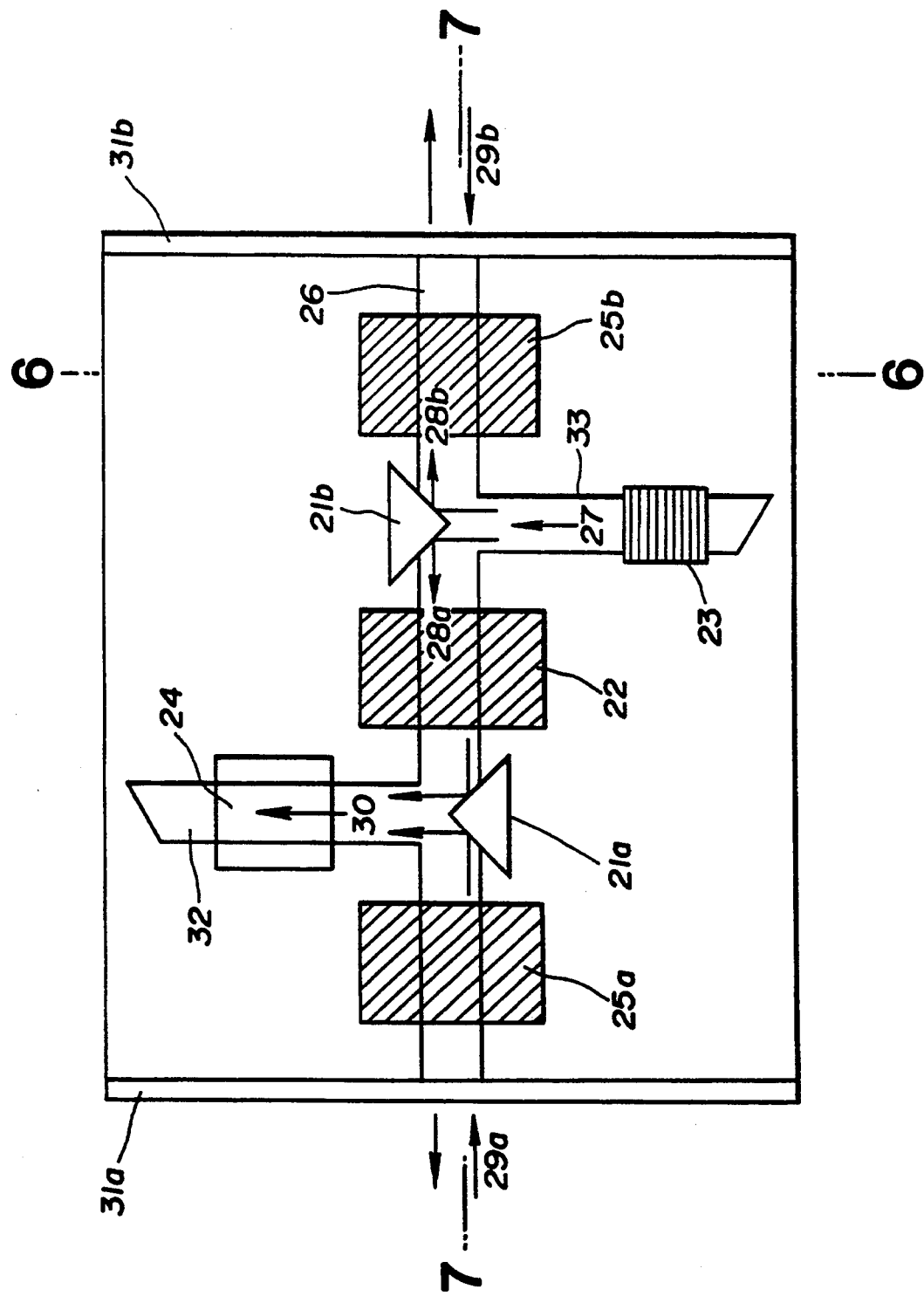
FIG. 5 is a plan view of a second embodiment of the present invention.
Figure 6:
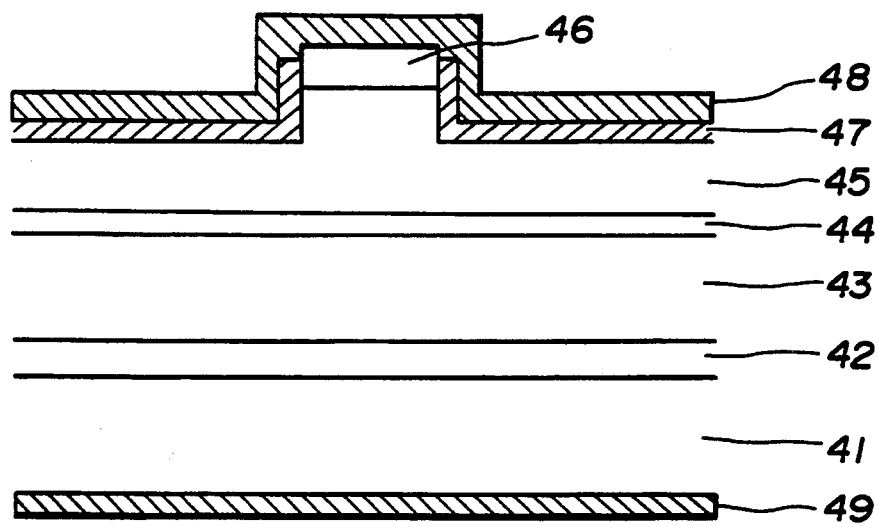
FIG. 6 is a cross-sectional view taken along a line A—A' of FIG. 5.
Figure 7:
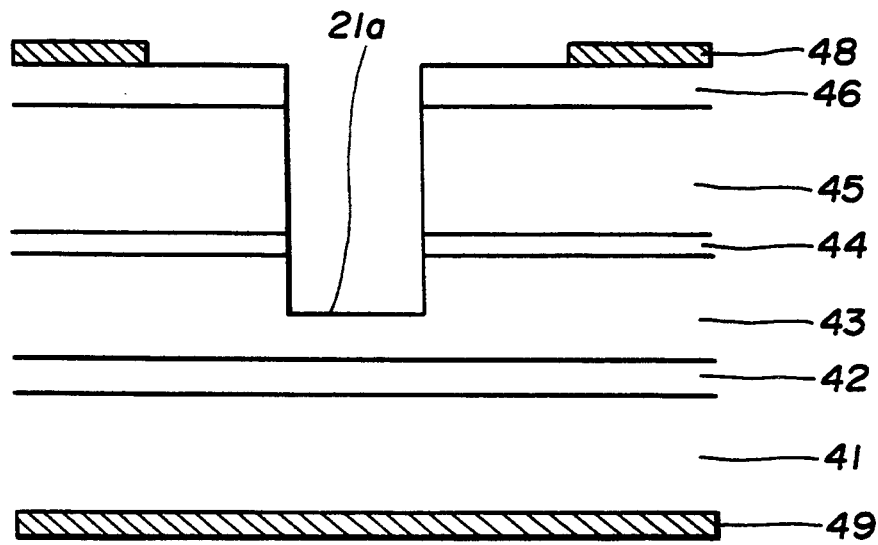
FIG. 7 is a cross-sectional view taken along a line B—B' of FIG. 5.

FIG. 5 shows a second embodiment of the present invention. In the second embodiment, transmitter and receiver portions 23 and 24 are formed on a common semiconductor substrate 41 as well as optical amplifiers 22, 25a and 25b. FIGS. 6 and 7 are respectively 6—6' cross-sectional and 7—7' cross-sectional views of FIG. 5.

In FIG. 5, there are provided optical couplers 21a and 21b having the same structure as those of the first embodiment, the optical amplifiers 22, 25a and 25b which operate by the current injection below threshold, the transmitter portion 23 which consists of a distributed feedback (DFB) type laser, the receiver portion 24 having a photodetector of a semiconductor laser structure which operates by the application of a reverse bias voltage, a main waveguide 26 forming a bus line, sub-waveguides 32 and 33 having slant ends and antireflection coats 31a and 31b formed on end surfaces of the instant device and having the same layer structure as those of the first embodiment.

As is shown in FIGS. 6 and 7, a buffer layer 42 of an n-type GaAs layer, a first clad layer 43 of an AlGaAs layer, an active layer 44, a second clad layer 45 of a p-type AlGaAs layer and a cap layer 46 of a p-type GaAs layer are successively grown in this order on the substrate 41 of an n-type GaAs layer. Further, an insulating film 47 of SiN layer, an Au-Cr electrode 48 which functions as a p-type ohmic electrode and an AuGe-Cr electrode 49 which functions as an n-type ohmic electrode are formed.

The operation of the second embodiment is as follows. A light wave 27 transmitted from the transmitter portion 23 is branched into two light waves 28a and 28b propagated through the main waveguide 26 in opposite directions by the coupler 21b. The light wave 28b is amplified by the optical amplifier 25b and is emitted through the antireflection coat 31b. On the other hand, the light wave 28a is subjected to a light loss of −6 dB when passing through the coupler 21a. Therefore, after being amplified by the optical amplifier 22 which has the amplification factor to compensate for such light loss, the light wave 28a is further amplified by the optical amplifier 25a which has the same amplification factor as that of the optical amplifier 25b and is emitted through the antireflection factor 31b with the same intensity as that of the light wave 28b amplified by the optical amplifier 25b. A part of the light wave 28a is branched by the coupler 21a to generate a light wave 30 and the light wave 30 is guided to the receiver portion 24. It is hence possible to monitor a signal component of the light wave 28a by the receiver portion 24.

A light wave 29a incident on the left end of the main waveguide 26 through the antireflection coat 31a arrives at the coupler 21a after being amplified by the optical amplifier 25a. A part of the light wave 29a is reflected by the coupler 21a, and its signal component is detected by the receiver portion 24. The light wave 29a passing through the coupler 21a is emitted through the antireflection coat 31b after passing through the optical amplifier portion 22, the coupler 21b and the optical amplifier portion 25b.

On the other hand, a light wave 29b incident on the right end of the main waveguide 26 through the antireflection coat 31b reaches coupler 21b after being amplified by the optical amplifier 25b. At this time, the light wave 29b transmitted through the coupler 21b is subjected to a light loss of −6 dB. Therefore, after being amplified by the optical amplifier 22 which has the amplification factor to compensate for such light loss, the light wave 29b is branched by the coupler 21a and is detected by the receiver portion 24 with the same intensity as that of the light wave 29a. The light wave 29b passing through the coupler 21a is then amplified by the optical amplifier 25a and is emitted through the antireflection coat 31a with the same intensity as that of the light wave 29a emitted through the antireflection coat 31b.

In this embodiment, parts of the light waves 29a and 29b are respectively branched by the coupler 21b and are guided towards the transmitter portion 23, and therefore, it is necessary to insert an isolator (not shown) for stabilizing the oscillation frequency of the transmitter portion 23. In this case, an isolator having a well-known structure may be used.

When the amplification factors of the optical amplifiers 25a and 25b are set so that light losses caused by the couplers 21a and 21b, coupling losses caused at the right and left end surfaces of the main waveguide 26 and propagation losses caused by the main waveguide 26 are compensated for, the device can function as a light transmission and receiving node that has no apparent losses. In this case, multi-stage connection of the nodes can also be adopted.

In the second embodiment, resonator surfaces of the laser of the transmitter portion 23 are formed by the DFB structure, but, the resonator surfaces may also be formed with cleaved surfaces or etched surfaces formed by etching such as RIBE process, reactive ion etching (RIE) process and focused ion beam etching (FIBE) process.

In the above-discussed embodiments, the active region is formed with a double-hetero (DH) structure, but the active region may also be formed with a single quantum well (SQW) structure, a multiple quantum well (MQW) structure or similar structure In the above-discussed embodiments, the channel waveguide is formed by a ridge wave structure, but the waveguide may also be formed with a burying heterostripe (BH) structure, a channel-substrate planer stripe (CPS) structure or similar structure. Further, an index waveguide type laser and a gain waveguide type laser such as those of a stripe electrode type and a proton bombard type may be effectively used.

As to materials of the semiconductor, InP-InGaAs series and AlGaInP series may be used as well as the above GaAs-AlGaAs series.

As explained in the foregoing, an optical amplifier portion is interposed between at least two couplers or bi-directional branching and/or combining devices in the optical device of the present invention. Therefore, light waves propagated through a main or first waveguide in opposite directions and light waves propagated through second and third waveguides connected to the first waveguide in opposite dierections can be combined at desired intensity ratios. Further, the coupler performs the splitting of the wave front at least in a horizontal direction, and in this case the process accuracy in a depth direction can be tolerated and the coupler can be fabricated only with a positional accuracy in the horizontal direction.

Figure 8:
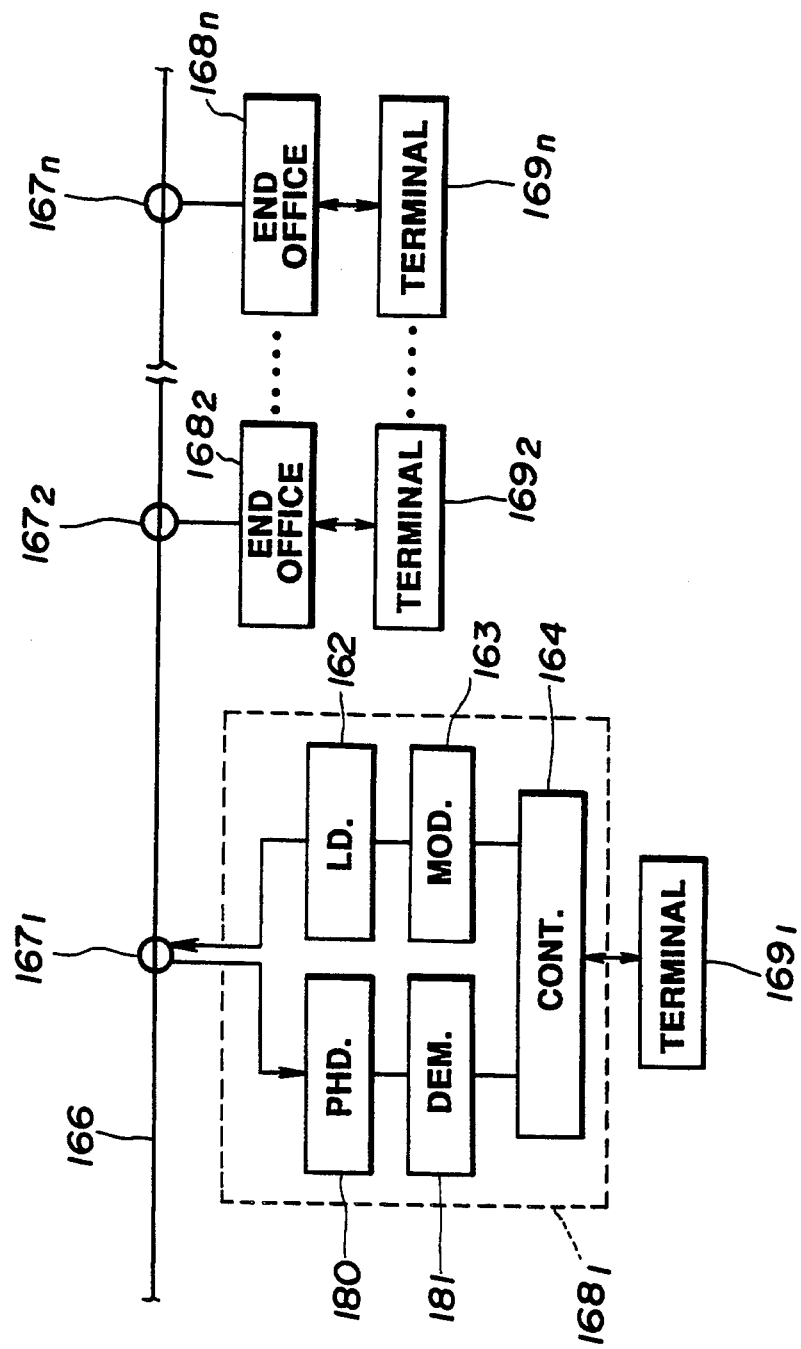
FIG. 8 is a block diagram of an optical communication system including an optical decive of the present invention.

FIG. 8 shows a block diagram illustrating an optical communication system in which the embodiment of FIG. 2 or FIG. 5 is used as an optical node or a combination of an optical node, a photodetector and a laser light source. In FIG. 8, reference numeral 166 is an optical fiber for transmitting light signals. A plurality of end offices $168_1$, $168_2$, . . . , $168_n$ are connected to the fiber 166 through optical nodes $167_1$, $167_2$, . . . , $167_n$. respectively. To the respective end offices, are connected terminals $169_1$, $169_2$, . . . , $169_n$ which include a keyboard, a display device, etc. In each end office, there are provided a light signal transmitter consisting of a laser light source (LD) 162 and a modulator (MOD) 163 and a light signal receiver consisting of a photodetector (PHD) 180 and a demodulator (DEM) 181. These transmitter and receiver are controlled by a controller (CONT) 164 according to instructions from the terminal $169_1$. The first embodiment of the present invention can be used as the optical node $167_1$, $167_2$, . . . , $167_n$. In this case, an optical amplifier may be inserted between the optical nodes 167. The second embodiment of the present invention can be used as an optical device in which the node 167, the photodetector 180 and tile laser light source 162 are integrated on a common substrate.

As an access control system, carrier sense multiple access (CSMA)/collision detection (CD), token passing system or the like can be utilized. The optical device of the present invention can, of course, be used in any type of an optical communication system (such as a loop type and a star type).

While the present invention has been described with respect to what is presently considered to be the preferred embodiment, it is understood that the invention is not limited to the disclosed embodiments. The present invention is intended to cover various modifications and equivalent arrangements included within the spirit and scope of the appended claims.

What is claimed is:

1. An optical device comprising:
   first light guiding means for guiding a light wave;
   second light guiding means for guiding a light wave, said second light guiding means being connected to said first light guiding means at a first position;
   third light guiding means for guiding a light wave, said third light guiding means being connected to said first light guiding means at a second position different from said first position;
   light combining means arranged near said first position;
   light branching means arranged near said second position;
   an optical amplifier arranged on said first light guiding means between said first and second positions for compensating for a light loss of the light wave caused by each of said light branching and light combining means,
   wherein an amplification factor of said optical amplifier arranged on said first light guiding means between said first and second positions is set so that the light waves entering said first light guiding means from opposite directions are guided into said second light guiding means with the same intensity; and
   further optical amplifiers respectively arranged at opposite ends of said first light guiding means.

2. An optical device according to claim 1, further comprising a semiconductor substrate, and wherein said first, second and third light guiding means respectively comprise channel waveguides monolithically integrated with said light branching and light combining means, and said optical amplifier on said semiconductor substrate.

3. An optical device according to claim 1, wherein said first light guiding means comprises an active layer.

4. An optical device according to claim 1, wherein said light branching and light combining means respectively comprise etched grooves for splitting a wave front of the light wave at least with respect to a horizontal direction of said first light guiding means.

5. An optical device according to claim 4, wherein said first light guiding means comprises an active layer and said etched grooves respectively extend in a depth direction beyond said active layer.

6. An optical device according to claim 4, wherein said etched grooves respectively comprise two end surfaces forming right angles relative to each other and said end surfaces respectively extend in the horizontal direction of said first light guiding means from a central point of said first and second positions forming angles of 45 degrees relative to opposite propagation directions of the wave light in said first light guiding means.

7. An optical device according to claim 4, wherein said etched grooves are respectively formed deviated from a central line of said first light guiding means extending along a propagation direction of the light wave in said first light guiding means.

8. An optical device according to claim 1, wherein each of said second and third light guiding means is connected to said first light guiding means in a T-shaped configuration and a Y-shaped configuration, respectively.

9. An optical device according to claim 1, further comprising a receiver portion for receiving the light wave propagated through said second light guiding means, and wherein said light branching couples the light waves propagated through said first light guiding means in opposite directions to said second light guiding means at equal branching ratios.

10. An optical device according to claim 1, further comprising a transmitter portion for transmitting the light wave propagated through said third light guiding means, and wherein said light combining means couples the light wave propagated through said third light guiding means to said first light guiding means in opposite directions at equal branching ratios.

11. An optical device according to claim 10, wherein said transmitter portion comprises a semiconductor laser.

12. An optical device comprising:
first light guiding means for guiding a light wave;
second light guiding means for guiding a light wave, said second light guiding means being connected to said first light guiding means at a first position;
third light guiding means for guiding a light wave, said third light guiding means being connected to said first light guiding means at a second position different from said first position;
light combining means arranged near said first position;
light branching means arranged near said second position;
an optical amplifier arranged on said first light guiding means between said first and second positions for compensating for a light loss of the light wave caused by each of said light branching and light combining means, said optical amplifier comprising a semiconductor laser which operates by a current injection below threshold,
wherein an amplification factor of said optical amplifier is set so that the light waves entering said first light guiding means from opposite directions are guided into said second light guiding means with the same intensity.

13. An optical device comprising:
first light guiding means for guiding a light wave;
antireflection coatings formed on opposite ends of said first light guiding means;
second light guiding means for guiding a light wave, said second light guiding means being connected to said first light guiding means at a first position;
third light guiding means for guiding a light wave, said third light guiding means being connected to said first light guiding means at a second position different from said first position;
light combining means arranged near said first position;
light branching means arranged near said second position;
an optical amplifier arranged on said first light guiding means between said first and second positions for compensating for a light loss of the light wave caused by each of said light branching and light combining means,
wherein an amplification factor of said optical amplifier is set so that the light waves entering said first light guiding means from opposite directions are guided into said second light guiding means with the same intensity.

14. An optical device comprising:
first light guiding means for guiding a light wave;
second light guiding means for guiding a light wave, said second light guiding means being connected to said first light guiding means at a first position;
third light guiding means for guiding a light wave, said third light guiding means being connected to said first light guiding means at a second position different from said first position;
light combining means arranged near said first position;
light branching means arranged near said second position;
an optical amplifier arranged on said first light guiding means between said first and second positions for compensating for a light loss of the light wave caused by each of said light branching and light combining means,
wherein an amplification factor of said optical amplifier is set so that the light waves entering said first light guiding means from opposite directions are guided into said second light guiding means with the same intensity; and
a receiver portion for receiving the light wave propagated through said second light guiding means, and wherein said light branching means couples the light waves propagated through said first light guiding means in opposite directions to said second light guiding means at equal branching ratios, said receiver portion comprising a photodetector having a semiconductor laser structure which operates by applying a reverse bias voltage.

15. An optical device comprising:
first light guiding means for guiding a light wave;
second light guiding means for guiding a light wave, said second light guiding means being connected to said first light guiding means at a first position;
third light guiding means for guiding a light wave;
fourth light guiding means for guiding a light wave, said fourth light guiding means being connected to said third light guiding means at a second position different from said first position;
fifth light guiding means for guiding a light wave, said fifth light guiding means extending between said first and second positions;
light combining means arranged near said first position;
light combining means arranged near said second position; and
an optical amplifier arranged on said fifth light guiding means between said first and second positions for compensating for a light loss of the light wave caused by each of said light branching and light combining means, wherein an amplification factor of said optical amplifier is set so that the light waves entering said first and third light guiding means from opposite directions are guided into said second light guiding means with the same intensity; and
further optical amplifiers respectively arranged at opposite ends of said fifth light guiding means.

16. An optical communication system comprising:
a plurality of optical nodes each comprising an optical device comprising a first light waveguide for guiding a light wave, a second light waveguide for guiding a light wave which is connected to said first light waveguide at a first position, a third light waveguide for guiding a light wave which is connected to said first light waveguide at a second position different from the first position, a light combining device arranged near the first position, a light branching device arranged near the second position, and an optical amplifier arranged on said first light waveguide between the first and second positions for compensating for a light loss of the light wave caused by each of said light branching device and said light combining device, a light transmission line for connecting said nodes, said light transmission line being connected to said first light waveguide, and further optical amplifiers respectively arranged at opposite ends of the first light guiding means, wherein an amplification factor of said optical amplifier arranged on said first light waveguide between the first and second positions is set so that the light waves entering said first light waveguide from opposite directions are guided into said second light waveguide with the same intensity.

17. An optical device comprising:

first light guiding means for guiding a light wave;

second light guiding means for guiding a light wave, said second light guiding means being connected to said first light guiding means at a first position;

third light guiding means for guiding a light wave, said third light guiding means being connected to said first light guiding means at a second position different from said first position;

light combining means arranged near said first position;

light branching means arranged near said second position;

an optical amplifier arranged on said first light guiding means between said first and second positions for compensating for a light loss of the light wave caused by each of said light combining and light branching means, wherein an amplification factor of said optical amplifier is set so that the light waves from said third light guiding means are guided into said first light guiding means in opposite directions with the same intensity; and further optical amplifiers respectively arranged at opposite ends of said first light guiding means.

18. An optical device according to claim 17, further comprising a semiconductor substrate, and wherein said first, second and third light guiding means respectively comprise channel waveguides monolithically integrated with said light branching means and light combining means, and said optical amplifier on said semiconductor substrate.

19. An optical device according to claim 17, wherein said first light guiding means comprises an active layer.

20. An optical device according to claim 17, wherein said light branching means and light combining means respectively comprise etched grooves for splitting a wave front of the light wave at least with respect to a horizontal direction of said first light guiding means.

21. An optical device according to claim 20, wherein said first light guiding means comprises an active layer and said etched grooves respectively extend in a depth direction beyond said active layer.

22. An optical device according to claim 20, wherein said etched grooves respectively comprise two end surfaces forming right angles relative to each other and said end surfaces respectively extend in the horizontal direction of said first light guiding means from a central point of said first and second positions forming angles of 45 degrees relative to opposite propagation directions of the wave light in said first light guiding means.

23. An optical device according to claim 20, wherein said etched grooves are respectively formed deviated from a central line of said first light guiding means extending along a propagation direction of the light wave in said first light guiding means.

24. An optical device according to claim 17, wherein each of said second and third light guiding means is connected to said first guiding means in a T-shaped configuration and a Y-shaped configuration, respectively.

25. An optical device according to claim 17, further comprising a receiver portion for receiving the light wave propagated through said second light guiding means, and wherein said light branching means couples the light waves propagated through said first light guiding means in opposite directions to said second light guiding means at equal branching ratios.

26. An optical device according to claim 17, further comprising a transmitter portion for transmitting the light wave propagated through said third light guiding means, and wherein said light combining means couples the light waves propagated through said third light guiding means to said first light guiding means in opposite directions at equal combining ratios.

27. An optical device according to claim 26, wherein said transmitter portion comprises a semiconductor laser.

28. An optical device comprising:

first light guiding means for guiding a light wave;

second light guiding means for guiding a light wave, said second light guiding means being connected to said first light guiding means at a first position;

third light guiding means for guiding a light wave, said third light guiding means being connected to said first light guiding means at a second position different from said first position;

light combining means arranged near said first position;

light branching means arranged near said second position;

an optical amplifier arranged on said first light guiding means between said first and second positions for compensating for a light loss of the light wave caused by each of said light combining and light branching means, said optical amplifier comprising a semiconductor laser which operates by a current injection below threshold;

wherein an amplification factor of said optical amplifier is set so that the light waves from said third light guiding means are guided into said first light guiding means in opposite directions with the same intensity.

29. An optical device comprising:

first light guiding means for guiding a light wave;

antireflection coatings formed on opposite ends of said first light guiding means;

second light guiding means for guiding a light wave, said second light guiding means being connected to said first light guiding means at a first position;

third light guiding means for guiding a light wave, said third light guiding means being connected to said first light guiding means at a second position different from said first position;

light combining means arranged near said first position;

light branching means arranged near said second position;

an optical amplifier arranged on said first light guiding means between said first and second positions for compensating for a light loss of the light wave caused by each of said light branching and light combining means; and wherein an amplification factor of said optical amplifier is set so that the light waves from said third light guiding means are guided into said first light guiding means in opposite directions with the same intensity.

30. An optical device comprising:
first light guiding means for guiding a light wave;
second light guiding means for guiding a light wave, said second light guiding means being connected to said first light guiding means at a first position;
third light guiding means for guiding a light wave, said third light guiding means being connected to said first light guiding means at a second position different from said first position;
light combining means arranged near said first position;
light branching means arranged near said second position;
an optical amplifier arranged on said first light guiding means between said first and second positions for compensating for a light loss of the light wave caused by each of said light combining and light branching means, wherein an amplification factor of said optical amplifier is set so that the light waves from said third light guiding means are guided into said first light guiding means in opposite directions with the same intensity; and
a receiver portion for receiving the light wave propagated through said second light guiding means, and wherein said light branching means couples the light waves propagated through said first light guiding means in opposite directions to said second light guiding means at equal branching ratios,
wherein said receiver portion comprises a photodetector having a semiconductor laser structure which operates by applying a reverse bias voltage.

31. An optical device comprising:
first light guiding means for guiding a light wave;
second light guiding means for guiding a light wave, said second light guiding means being connected to said first light guiding means at a first position;
third light guiding means for guiding a light wave;
fourth light guiding means for guiding a light wave, said fourth light guiding means being connected to said third light guiding means at a second position different from said first position;
fifth light guiding means for guiding a light wave, said fifth light guiding means extending between said first and second positions;
light combining means arranged near said first position;
light branching means arranged near said second position; and
an optical amplifier arranged on said fifth light guiding means between said first and second positions for compensating for a light loss of the light wave caused by each of said light combining and light branching means;
wherein an amplification factor of said optical amplifier is set so that the light waves from said fourth light guiding means are guided into said first and third light guiding means in opposite directions with the same intensity; and
further optical amplifiers respectively arranged at opposite ends of said fifth light guiding means.

32. An optical communication system comprising:
a plurality of optical nodes each comprising an optical device comprising first light waveguide for guiding a light wave, a second light waveguide for guiding a light wave which is connected to said first light waveguide at a first position, a third light waveguide for guiding a light wave which is connected to said first light waveguide at a second position different from the first position, a light combining device arranged near the second position, and an optical amplifier arranged near the first position, a light branching device arranged on said first light waveguide between the first and second positions for compensating for a light loss of the light wave caused by each of said light combining device and light branching device;
a light transmission line for connecting said nodes, said light transmission line being connected to said first light waveguide; and
further optical amplifiers respectively arranged at opposite ends of said first light guiding means,
wherein an amplification factor of said optical amplifier arranged near the first position is set so that the light waves from said third light waveguide are guided into said first light waveguide in opposite directions with the same intensity.

33. An optical device comprising:
first light guiding means for guiding a light wave;
second light guiding means for guiding a light wave, said second light guiding means being connected to said first light guiding means at a first position;
third light guiding means for guiding a light wave, said third light guiding means being connected to said first light guiding means at a second position different from said first position;
first light combining means arranged near said first position;
second light combining means arranged near said second position;
an optical amplifier arranged on said first light guiding means between said first and second positions for compensating for a light loss of the light wave caused by each of said first and second light combining means;
further optical amplifiers respectively arranged at opposite ends of said first light guiding means,
wherein an amplification factor of said optical amplifier arranged on said first light guiding means between said first and second positions is set so that the light waves entering said first light guiding means from opposite directions are respectively guided into said second and third light guiding means with the same intensity.

34. An optical device according to claim 33, further comprising a semiconductor substrate, and wherein said first, second and third light guiding means respectively comprise channel waveguides monolithically integrated with said first and second light combining means, and said optical amplifier on said semiconductor substrate.

35. An optical device according to claim 33, wherein said first light guiding means comprises an active layer.

36. An optical device according to claim 33, wherein said first and second light combining means respectively comprise etched grooves for splitting a wave front of the light wave at least with respect to a horizontal direction of said first light guiding means.

37. An optical device according to claim 36, wherein said first light guiding means comprises an active layer and said etched grooves respectively extend in a depth direction beyond said active layer.

38. An optical device according to claim 36, wherein said etched grooves respectively comprise two end surfaces forming right angles relative to each other and said end surfaces respectively extend in the horizontal direction of said first light guiding means from a central point of said first and second positions forming angles of 45 degrees relative to opposite propagation directions of the wave light in said first light guiding means.

39. An optical device according to claim 36, wherein said etched grooves are respectively formed deviated from a central line of said first light guiding means extending along a propagation direction of the light wave in said first light guiding means.

40. An optical device according to claim 33, wherein each of said second and third light guiding means is connected to said first guiding means in a T-shaped configuration and a Y-shaped configuration, respectively.

41. An optical device comprising:
first light guiding means for guiding a light wave;
second light guiding means for guiding a light wave, said second light guiding means being connected to said first light guiding means at a first position;
third light guiding means for guiding a light wave, said third light guiding means being connected to said first light guiding means at a second position different from said first position;
first light combining means arranged near said first position;
second light combining means arranged near said second position;
an optical amplifier arranged on said first light guiding means between said first and second positions for compensating for a light loss of the light wave caused by each of said first and second light combining means, said optical amplifier comprising a semiconductor laser which operates by a current injection below threshold,
wherein an amplification factor of said optical amplifier is set so that the light waves entering said first light guiding means from opposite directions are respectively guided into said second and third light guiding means with the same intensity.

42. An optical device comprising:
first light guiding means for guiding a light wave;
antireflection coatings formed on opposite ends of said first light guiding means;
second light guiding means for guiding a light wave, said second light guiding means being connected to said first light guiding means at a first position;
third light guiding means for guiding a light wave, said third light guiding means being connected to said first light guiding means at a second position different from said first position;
first light combining means arranged near said first position;
second light combining means arranged near said second position; and
an optical amplifier arranged on said first light guiding means between said first and second positions for compensating for a light loss of the light wave caused by each of said first and second light combining means;
wherein an amplification factor of said optical amplifier is set so that the light waves entering said first light guiding means from opposite directions are respectively guided into said second and third light guiding means with the same intensity.

43. An optical device comprising:
first light guiding means for guiding a light wave;
second light guiding means for guiding a light wave, said second light guiding means being connected to said first light guiding means at a first position;
third light guiding means for guiding a light wave;
fourth light guiding means for guiding a light wave, said fourth light guiding means being connected to said third light guiding means at a second position different from said first position;
fifth light guiding means for guiding a light wave, said fifth light guiding means extending between said first and second positions;
first light combining means arranged near said first position;
second light combining means arranged near said second position;
an optical amplifier arranged on said fifth light guiding means between said first and second positions for compensating for a light loss of the light wave caused by each of said first and second light combining means; and
further optical amplifiers respectively arranged at opposite ends of said fifth light guiding means,
wherein an amplification factor of said optical amplifier arranged on the fifth light guiding means is set so that the light waves entering said first and third light guiding means from opposite directions are respectively guided into said second and third light guiding means with the same intensity.

44. An optical communication system comprising:
a plurality of optical nodes each comprising an optical device comprising first light waveguide for guiding a light wave, a second light waveguide for guiding a light wave which is connected to said first light waveguide at a first position, a third light waveguide for guiding a light wave which is connected to said first light waveguide at a second position different from the first position, a first light combining device arranged near the first position, a second light combining device arranged near the second position, and an optical amplifier arranged on said first light waveguide between the first and second positions for compensating for a light loss of the light wave caused by each of said first and second light combining devices;
a light transmission line for connecting said nodes, said light transmission line being connected to said first light waveguide; and
further optical amplifiers respectively arranged at opposite ends of said first light guiding means,
wherein an amplification factor of said optical amplifier arranged on said first light waveguide between the first and second positions is set so that the light waves entering said first light waveguide from opposite directions are respectively guided into said second and third light waveguides with the same intensity.

* * * * *

UNITED STATES PATENT AND TRADEMARK OFFICE
CERTIFICATE OF CORRECTION

PATENT NO. : 5,369,719

DATED : November 29, 1994

INVENTOR(S) : Mishima et al.

It is certified that error appears in the above-indentified patent and that said Letters Patent is hereby corrected as shown below:

In the title page:

[57] ABSTRACT:

Line 4, "tight" should read --light--.

COLUMN 2:

Lines 43-44, "device 6." should read --devices.--.

COLUMN 3:

Line 53, "an 3-'" should read --a 3-3--; and
Line 54, "4-4'" should read --4-4--.

COLUMN 5:

Line 41, "6-6'" should read --6-6--; and
Line 42, "7-7'" should read --7-7--.

COLUMN 7:

Line 24, "dierections" should read --directions--; and
Line 53, "tile" should read --the--.

COLUMN 12:

Line 45, "threshold;" should read --threshold,--.

UNITED STATES PATENT AND TRADEMARK OFFICE
CERTIFICATE OF CORRECTION

PATENT NO. : 5,369,719
DATED : November 29, 1994
INVENTOR(S) : Mishima et al.

It is certified that error appears in the above-indentified patent and that said Letters Patent is hereby corrected as shown below:

COLUMN 14:

Line 2, "first" should read --a first--.

COLUMN 15:

Line 19, "first guiding means" should read --first light guiding means--.

COLUMN 16:

Line 2, "means;" should read --means,--; and
Line 40, "first" should read --a first--.

Signed and Sealed this

Twenty-third Day of May, 1995

Attest:

BRUCE LEHMAN

*Attesting Officer*    *Commissioner of Patents and Trademarks*